United States Patent

[11] 3,633,269

[72] Inventor Alfred Bachmeier
Schwaigern, Germany
[21] Appl. No. 836,107
[22] Filed June 24, 1969
[45] Patented Jan. 11, 1972
[73] Assignee Telefunken Patentverwertungsgesellschaft MbH
Ulm (Danube), Germany

[54] METHOD OF MAKING CONTACT TO SEMICONDUCTOR DEVICES
10 Claims, 6 Drawing Figs.

[52] U.S. Cl. .......... 29/578, 29/589, 156/247, 117/212
[51] Int. Cl. .......... B01j 17/00, H01l 5/00
[50] Field of Search .......... 117/212, 8.5, 50, 51; 29/577, 578, 589, 590, 591, 581, 424, 423, 426, 427

[56] References Cited
UNITED STATES PATENTS

| | | | |
|---|---|---|---|
| 3,469,308 | 9/1969 | Luce | 29/589 |
| 3,436,809 | 4/1969 | Peacock | 29/589 |
| 3,374,515 | 3/1968 | Girard | 156/233 |
| 3,350,250 | 10/1969 | Sanz et al. | 156/247 |
| 3,341,375 | 9/1967 | Hochberg et al. | 29/589 |

*Primary Examiner*—John F. Campbell
*Assistant Examiner*—W. Tupman
*Attorney*—Spencer & Kaye ABSTRACT: The disclosure relates to a method of making contact with semiconductor devices by applying a metal layer, e.g. nickel or aluminum, onto an insulating layer, e.g. silicon dioxide, on the semiconductor material and onto the surface of the semiconductor material itself through windows in the insulating material and removing the part of the metal layer applied to the insulating layer by means of an adhesive strip, the metal layer having been treated, during or after its application, by heat to render it more firmly bonded to the semiconductor material than to the insulating layer.

Inventor:
Alfred Bachmeier
By: Spencer & Kaye
Attorneys

Inventor:
Alfred Bachmeier
By: Spencer & Kaye
Attorneys

Inventor:
Alfred Bachmeier
By: Spencer & Kaye
Attorneys

METHOD OF MAKING CONTACT TO SEMICONDUCTOR DEVICES

BACKGROUND OF THE INVENTION

The invention relates to a method of making contact to semiconductor devices with an insulating layer on the surface of the semiconductor body, in which there are contact-making windows through which the regions on the surface of the semiconductor to which contact is to be made can be exposed.

In a known method, when making contact to planar devices, a masking layer of photolacquer is applied to the silicon dioxide layer and enables the contact-making window to be hollowed out of the silicon dioxide layer. A coherent metal layer is vapor-deposited both on the layer of photolacquer and in the contact-making windows and is wiped away or dissolved away together with the layer of lacquer with the exception of the regions vapor-deposited in the windows.

SUMMARY OF THE INVENTION

According to the invention there is provided a method of making contact to semiconductor devices with an insulating layer on the surface of the semiconductor body comprising the steps of forming contact-making windows in said insulating layer through which the regions of the surface of the semiconductor material to which contact is to be made are exposed, applying a coherent metal layer both to said insulating layer and to said regions exposed by said windows, bonding the metal layer more firmly to said exposed regions than to said insulating layer by means of a heat treatment, sticking a pulloff member onto said metal layer and subsequently pulling said pulloff member off again so as to thereby remove only the portions of said metal layer which are on said insulating layer because of their lesser adhesion, while the remaining parts of said metal layer remain on the exposed regions as metal coatings for making contact.

The invention is particularly suitable for making contact to planar devices such as planar transistors or planar diodes. In planar devices, the insulating layer is the silicon dioxide layer which is present in any case on the surface of the semiconductor and which, as is known, serves as a diffusion mask in the manufacture of the semiconductor regions and remains on the semiconductor body to protect the PN-junctions after the diffusion at the surface of the semiconductor body. Since the silicon dioxide layer is rigidly connected to the semiconductor body, it is no more entrained, when the metal layer is pulled off, than that part of the metal layer which was previously alloyed or sintered, by heat treatment, to the regions to which contact is to be made. For the first time, the pulling off enables the layer of photolacquer in the above-described known method to be dispensed with and the metal layer according to the invention to be applied directly to the silicon dioxide layer. Thus, as a result of the invention, a photolithographic process is saved. Apart from this economy, working without lacquer also has the advantage that no contamination of the vapor-deposition installation can occur through lacquer substances if the metal layer is vapor-deposited as is usual. The metal layer may, however, also be electrodeposited for example. The invention represents a neat method of making contact which is particularly suitable for making contact to semiconductor wafers having a large number of individual elements. An adhesive tape, an adhesive roll or in certain cases a solid body with adhesive at its underside may be used as a pulloff member.

BRIEF DESCRIPTION OF THE DRAWINGS

The invention will now be described in greater detail by way of example with reference to the accompanying drawings, in which.

DESCRIPTION OF THE PREFERRED EMBODIMENTS

Figure 1:
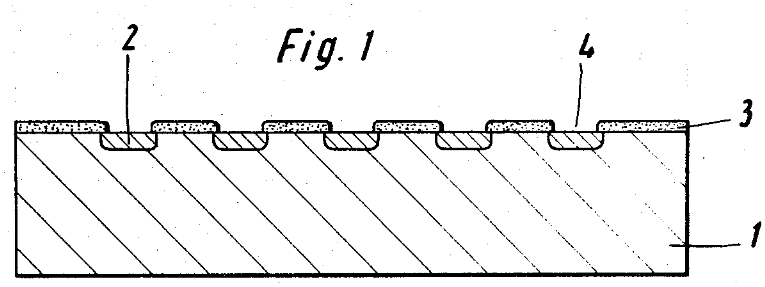
FIG. 1 shows a semiconductor wafer with a plurality of individual diodes.

FIG. 1 shows a semiconductor wafer with a plurality of individual diodes. The individual diodes are formed by the diffusion into specific regions of a semiconductor wafer having a specific type of conductivity, of semiconductor regions 2 of the opposite type of conductivity. The locally limited indiffusion is effected by the planar technique by etching diffusion windows 4 in a silicon dioxide layer 3 present on the surface of the semiconductor, through which windows the semiconductor regions 2 of the opposite type of conductivity are then diffused into the semiconductor wafer 1.

Figure 2:
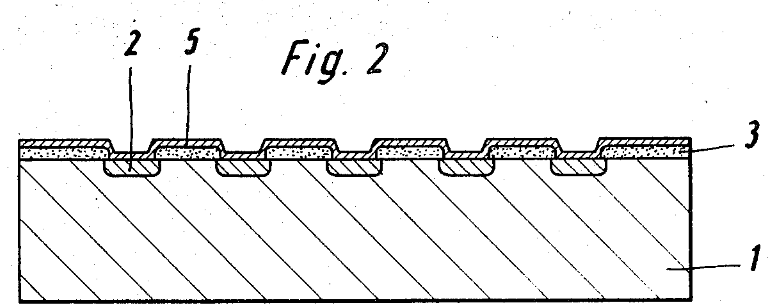
FIG. 2 shows the wafer of FIG. 1 after the application of a metal layer.

According to FIG. 2, a coherent metal layer 5, which covers both the silicon dioxide layer 3 and also the regions of the semiconductor surface exposed by the windows 4, is now vapor-deposited on one surface of the semiconductor wafer 1. In order that the metal layer 5 may adhere better to the regions to which contact is to be made than to the silicon dioxide layer 3, the metal layer is alloyed or sintered to the regions of the semiconductor wafer exposed through the windows 4. This heat treatment may be effected separately from the vapor-deposition or simultaneously with the vapor-deposition. If the alloying or sintering process is not effected simultaneously with the vapor-deposition but separately therefrom, then the metal layer 5 is vapor deposited cold and afterwards the system is heated to that temperature at which the metal layer alloys or sinters with the regions exposed through the windows 4. For example, if the metal layer 5 for making contact to the semiconductor regions 2 of the opposite type of conductivity consists of nickel, then heating is effected to about 650° C.

Figure 3:
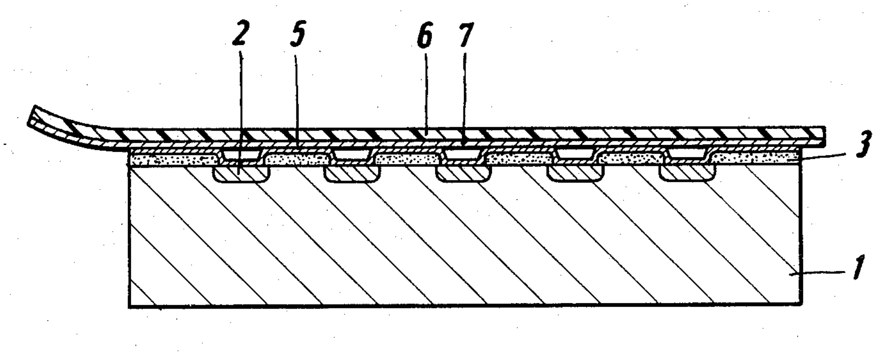
FIG. 3 shows the wafer of FIG. 2 with an adhesive strip pulloff member thereon.
Figure 4:
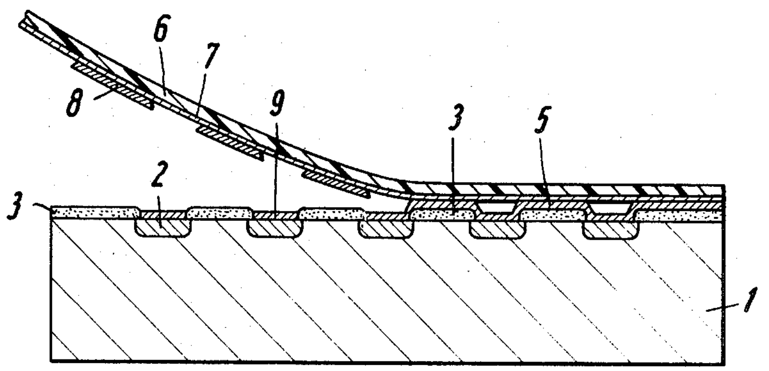
FIG. 4 shows the pulling-off operation in progress.
Figure 5:
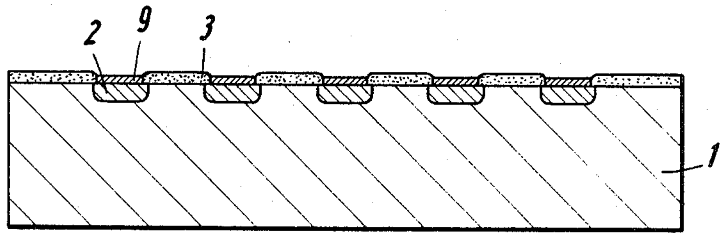
FIG. 5 shows the semiconductor wafer with the pulloff member having been removed.

As shown in FIG. 3, an adhesive strip 6 with the adhesive 7 is stuck on to the vapor-deposited metal layer 5 and is subsequently pulled off again as shown in FIG. 4. When it is being pulled off, the adhesive strip removes those parts 8 of the metal layer which were not in the contact-making windows but were on the silicon dioxide layer 3 as the silicon dioxide layer 3 was not firmly bonded to the vapor-deposited metal layer 5. Because of their satisfactory adhesive capacity, on the other hand, the parts 9 of the metal layer vapor-deposited in the contact-making windows adhere to the surface of the semiconductor. Finally, FIG. 5 shows the contacted semiconductor wafer with the five individual diodes after the adhesive tape has been pulled off.

Figure 6:
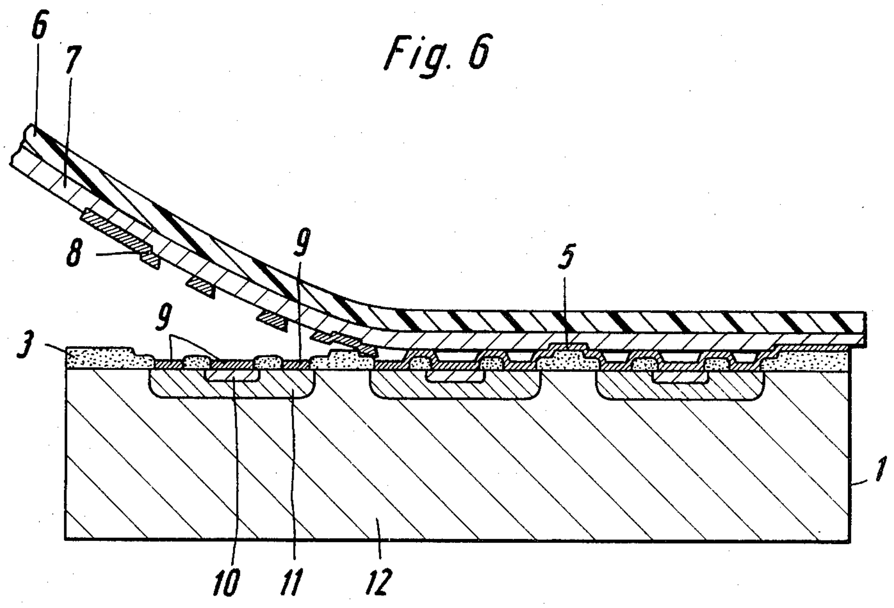
FIG. 6 shows a semiconductor wafer at a stage similar to that of FIG. 4, but with the invention applied to transistors instead of diodes.

The invention may naturally also be applied to making contact to transistors as shown in FIG. 6 for example. The semiconductor wafer 1 of FIG. 6 has three transistors, each of which consists of the emitter region 10, the base region 11 and the collector region 12. In order to make contact to the emitter and base regions 10 and 11, corresponding contact-making windows are provided for each transistor, which windows, as well as the silicon dioxide layer 3, are vapor deposited with metal. In the course of this, the coherent metal layer 5 is formed. As shown in FIG. 6, an adhesive strip 6 with an adhesive film 7 is also stuck onto the metal layer 5 during the making of contact to the transistors and is subsequently pulled off, the parts of the metal layer 5 present on the silicon dioxide layer being likewise removed when the adhesive strip is pulled off. All that remains of the metal layer are the metal coatings 9 in the contact-making windows which serve to make contact to the emitter and base regions of the planar transistors. After contact has been made, the semiconductor wafer 1 of FIG. 6 like the semiconductor wafer 1 of the example shown in FIGS. 1 to 5, is split up so that the individual elements are available separate from one another.

What I claim is new and desired to secure by Letters Patent of the United States is:

1. A method of making contact to semiconductor devices with an insulating layer on the surface of the semiconductor body comprising the steps of forming contact-making windows in said insulating layer to expose the regions of the surface of the semiconductor material to which contact is to be made applying a coherent metal layer both to said insulating layer and to said regions exposed by said windows, bonding the metal layer more firmly to said exposed regions than to said insulating layer by means of a heat treatment, sticking a pulloff member on to said metal layer and subsequently pulling said pulloff member off again so as to thereby remove only the portions of said metal layer which are on said insulating layer because of their lesser adhesion, while the remaining parts of said metal layer remain on the exposed regions as metal coatings for making contact.

2. A method as defined in claim 1, wherein said metal layer is alloyed to the exposed regions.

3. A method as defined in claim 1, wherein said metal layer is sintered to said exposed regions.

4. A method as defined in claim 1, wherein said metal layer is vapor-deposited.

5. A method as defined in claim 1, wherein said metal layer is electrodeposited.

6. A method as defined in claim 1, wherein such materials are used for said insulating layer and said metal layer that said metal layer adheres, under heat treatment, better to said regions to which contact is to be made than to the insulating layer.

7. A method as defined in claim 6, wherein said insulating layer consists of silicon dioxide.

8. A method as defined in claim 7, wherein said metal layer is a layer of a metal selected from nickel or aluminum.

9. A method as defined in claim 8, wherein when nickel is used as the material for said metal layer, said heat treatment is effected at a temperature at about 650° C.

10. A method as claimed in claim 1, wherein said pulloff member is an adhesive tape.

* * * * *